United States Patent [19]
Huang et al.

[11] Patent Number: 5,998,246
[45] Date of Patent: Dec. 7, 1999

[54] SELF-ALIGNED MANUFACTURING METHOD OF A THIN FILM TRANSISTOR FOR FORMING A SINGLE-CRYSTAL BOTTOM-GATE AND AN OFFSET DRAIN

[75] Inventors: Tiao-Yuan Huang; Horng-Chih Lin, both of Hsinchu, Taiwan

[73] Assignee: National Science Council of Republic of China, Taipei, Taiwan

[21] Appl. No.: 08/908,721

[22] Filed: Aug. 8, 1997

[51] Int. Cl.$^6$ ................................................ H01L 21/00
[52] U.S. Cl. ......................... 438/158; 438/159; 438/302
[58] Field of Search ............................. 438/151, 158, 438/159, 299, 301, 302, 303, 305, 306

[56] References Cited

U.S. PATENT DOCUMENTS 5,355,006  10/1994  Iguchi ..................................... 257/296

Primary Examiner—John F. Niebling
Assistant Examiner—Christopher Lattin
Attorney, Agent, or Firm—Bacon & Thomas

[57] ABSTRACT

The present invention is related to a self-aligned manufacturing method of a thin film transistor for forming a single-crystal bottom-gate and an offset drain. The main object of the present invention is to disclose two manufacturing methods to attain the self-aligned manufacturing method of a thin film transistor for forming a single-crystal bottom-gate and an offset drain. In the first method, a photoresistor and a silicon nitride are used to form a dual stack as a mask, further a large-angle ion implant is used to form a thin film transistor with a single-crystal bottom-gate and an offset drain. In the second method, the source side is protected by a dual stack formed by a P+ polysilicon layer which may be discarded selectively and a silicon nitride and an insulation spacer of sidewall in order to selectively discard the silicon nitride on the drain side, thus the object of a thin film transistor with a single-crystal bottom-gate and an offset drain is obtained.

10 Claims, 3 Drawing Sheets

SELF-ALIGNED MANUFACTURING METHOD OF A THIN FILM TRANSISTOR FOR FORMING A SINGLE-CRYSTAL BOTTOM-GATE AND AN OFFSET DRAIN

BACKGROUND OF THE INVENTION

1. Field of the Invention

The present invention relates to a self-aligned manufacturing method of a thin film transistor, especially to a self-aligned manufacturing method of a thin film transistor for forming a single-crystal bottom-gate and an offset drain.

2. Description of the Prior Art

Since in the single-crystal bottom gate the single-crystal is used as a gate, the gate insulation layer of gate can be grown directly on a single-crystal silicon, thus the quality thereof is better than those grown a polysilicon. Therefore, inherently the single-crystal bottom-gate has a particular advantage of forming high quality gate insulation layer. In 1990, Pfiester and other researchers has disclosed a self-aligning method for TFT with single-crystal gate [3], as shown in FIG. 1. However, this method is confined to fabricate a conventional non-offset drain transistor.

In recent years, it has been reported in many papers that the leakage current of a thin film transistor may be reduced effectively so to derive a preferred on/off current ratio in order to assert to obtain a high quality thin film transistor. For example, in reference [1, 2], if the length of an offset gate is within the range of 0.3–0.4 micrometers, the leakage current may be reduced effectively within the range of ten times to several hundred times, while the driving current is decreased slightly, therefore, the on/off current ratio is greatly improved. Thus a thin film transistor for forming a single-crystal bottom-gate and an offset drain will be an ideal element structure in the future. But nowadays there are no reports about a self-aligned forming method of a thin film transistor for forming a single-crystal bottom-gate and an offset drain.

SUMMARY OF THE INVENTION

Single-crystal bottom-gate may be used to obtain a high quality gate dielectric, while an offset drain transistor may be used to effectively reduce leakage current, thus a TFT with preferred on./off current ratio is obtained for sustaining the high performance of TFTs. Since the characteristic and quality of thin film transistor with single-crystal bottom-gate and offset drain is good, through a period of research, the inventor of the present invention has invented a self-aligned method of forming a thin film transistor with single-crystal bottom-gate and offset drain.

In the present invention, two brand-new methods are disclosed to attain the self-aligned method of a thin film transistor with single-crystal bottom-gate and offset drain.

In the first method, a photoresist and a silicon nitride are used to form a dual stack as a mask, further a large-angle ion implant is used to form a thin film transistor with a single-crystal bottom-gate and an offset drain. Although the first method is simple, however, in the application of practical high density static random access memory, since the memory cell is generally symmetric to the layout, the large-angle ion implant may not be used. Therefore, the inventor of the present invention has disclosed a second method, wherein the source side is protected by a dual stack formed by a P+ polysilicon layer which may be removed selectively and a silicon nitride and an insulation spacer of sidewall in order to selectively remove the silicon nitride on the drain side, thus the object of a thin film transistor with a single-crystal bottom-gate and an offset drain is obtained

BRIEF DESCRIPTION OF THE DRAWINGS

The invention, as well as its many advantages, may be further understood by the following description and drawings in which.

DETAILED DESCRIPTION OF THE PREFERRED EMBODIMENT

Figure 1A:
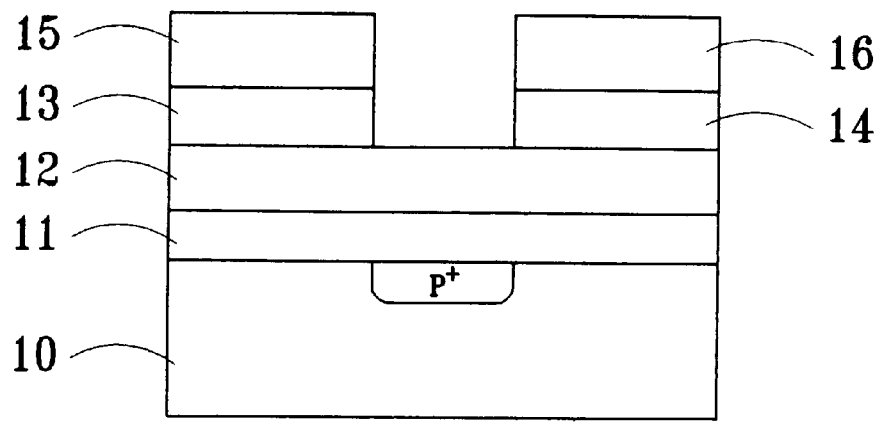
FIG. 1 is the manufacturing process of conventional thin film transistor.
Figure 1B:
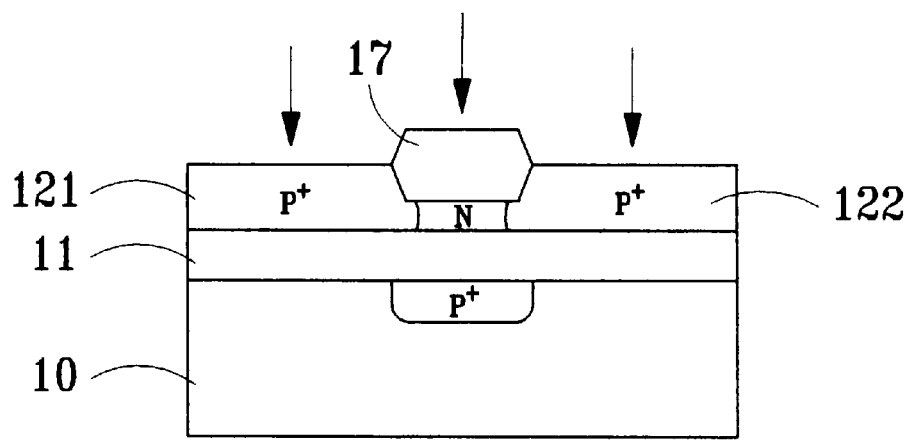

Firstly, a simple method is disclosed in the present invention, wherein by large-angle ion implant, a transistor with single-crystal bottom-gate and offset drain is formed. As shown in the drawings, the procedure of forming said transistor is as follows: a high quality oxide layer 21 is firstly grown on said single-crystal silicon 20. This oxide layer will become the dielectric of the gate of TFT, and then a thin polycrystal layer 22 is grown (or a amorphous layer is formed firstly, and then said layer is annealed for converting to a poly-crystal). Such a poly-crystal layer 22 will become an active channel of the TFT and the source/drain sections 221 and 222, and the height after growing is wider than the active region finished so as to leave a space for forming a block oxide layer (which is used to protect the active channel from being implanted during the implant of final source/drain ions). The consumption of silicon is about 0.45 unit for growing one unit width of silicon oxide). Now, a micro-image etching process may be used to remove said polysilicon layer, only the region which will form a active region, a source/drain 221 and 222 region is left.

Next, a layer of thin silicon nitride 23, 24 is formed thereon (generally the width thereof is about 50–200 nm). Thereby, an inverse-tone gate mask 25, 26 (which is exactly opposite to normal gate mask) and R I. E. corrosion is used to attain the condition as shown in FIG. 2. The process shown hereinbefore is the same to that described in reference 3.

Figure 2A:
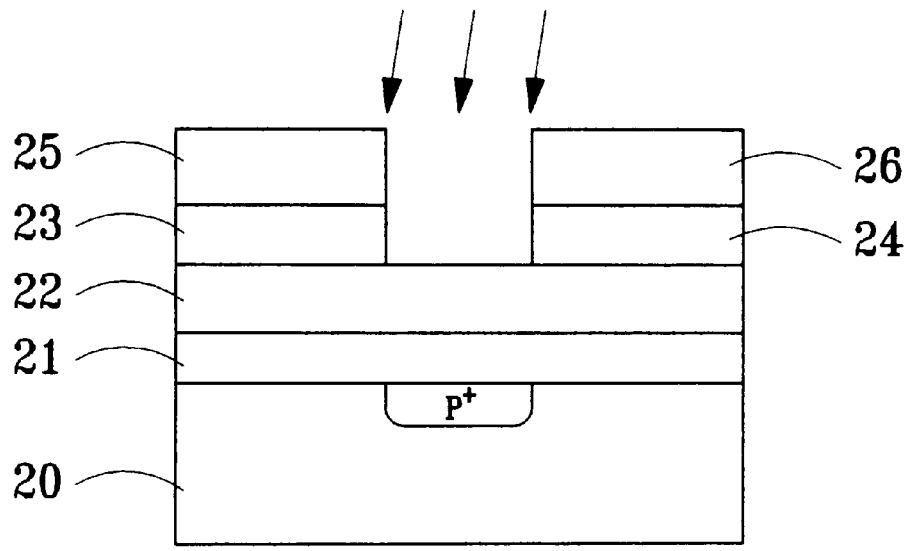
FIG. 2 is the first manufacturing process of the present invention.
Figure 2B:
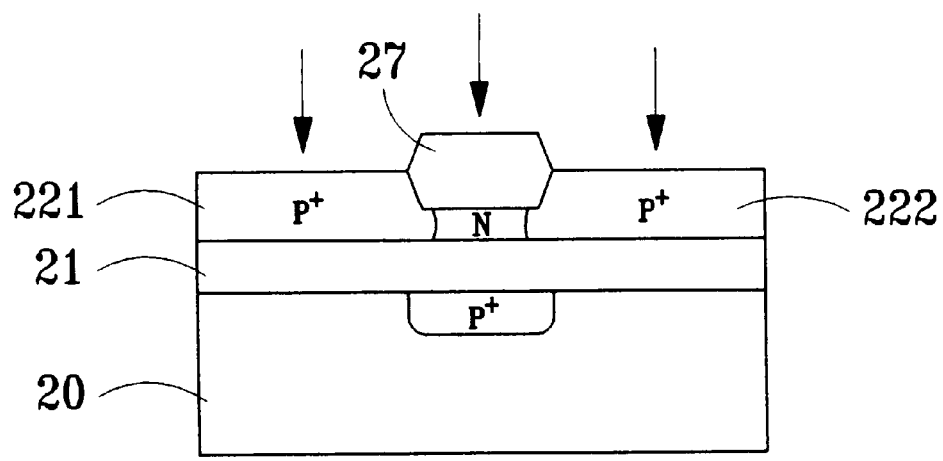

Next, instead of using the high energy ion implant with a zero degree tilt, in the present invention, the high energy ion implant with a large degree tilt is used, as shown in FIG. 2A, a P+ bottom-gate is grown on a single-crystal silicon substrate 20. The size of formed TFT may be decided from the size and direction of tilt angle and the aspect ratio of groove. While the aspect ratio of the groove is dependent from the ratio of the height formed by said photoresists 25 and 26, silicon nitrides 23 and 24 and polysilicon layer 22 to the length of the active channel of TFT. Then the photoresist layers 25 and 26 may be removed so that the silicon nitride 23 and 24 is exposed, which is further used to block the local oxidization. Within the region which has not been protected (i.e. the active channel region of TFT) the block oxide layer 27 is formed. Then the block oxide layer 27 is used to protect said active channel to perform the implant of source/drain 221 and 222 ions, even if to perform the silicated processing, while the other portion may be processed as that in the conventional process.

Said first method is relatively simple, however, in the application of high density static random access memory, since the memory cell has a generally symmetric layout, not all the drain of memory cells have the same orientation, therefore, a high angle ion implant may not be directly used to manufacture high density static random access memory. Accordingly, in the present invention, a brand-new method is disclosed to prevent said defect.

Figure 3A:
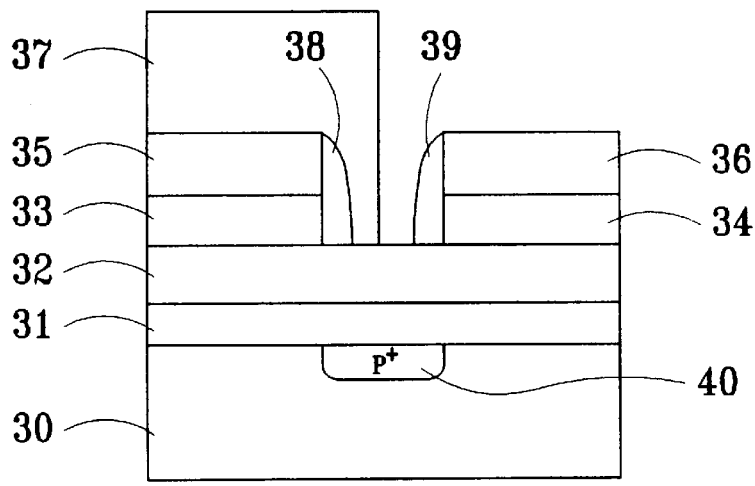
FIG. 3 is the second manufacturing process of the present invention.
Figure 3B:
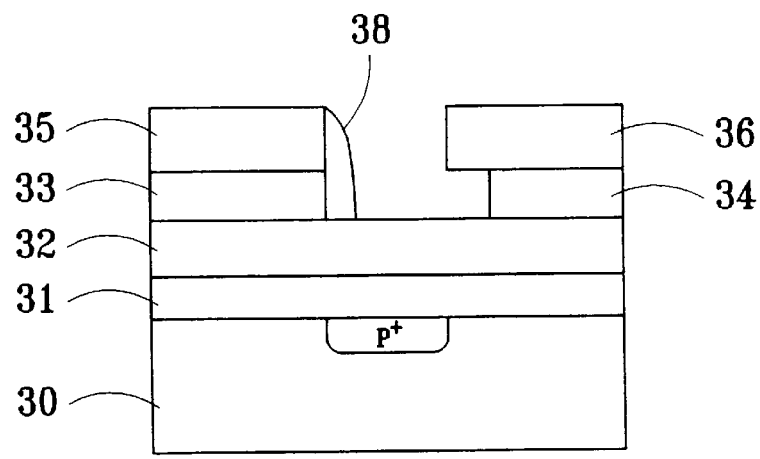
Figure 3C:
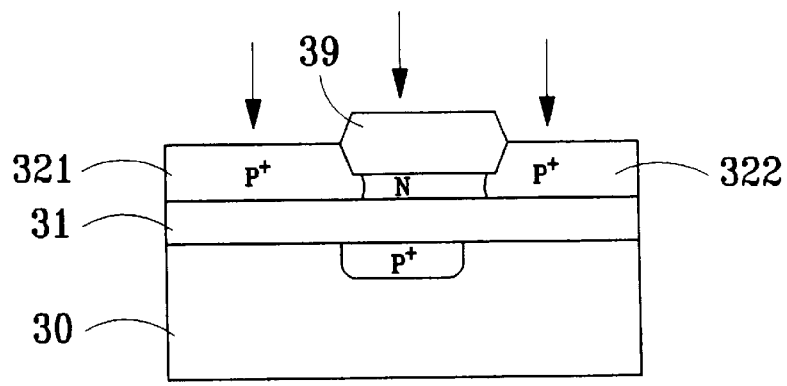

The second method of the present invention will be described in the following. As shown in FIG. 3, a double stack layer for removing P+ polysilicon layer 35 and 36 and the SiN 33 and 34, and an insulated spacer of side wall are used in this embodiment to protect said source side 321. The SiN 34 of the drain 322 is removed selectively, thus the thin film transistor of single-crystal bottom-gate and offset drain are manufactured.

According to the new process of the second method of the present invention, the process before the growth of said thin ploysilicon layer may be treated as that in reference [3] and the unnecessary polysilicon layer may be removed, only the final active channel and source/drain region is left. Further, the growth of single silicon nitride is different from that in reference [3] and the first method, the characteristics of the second method is that a dual stack layer of P+ type (or n+ type) polysilicons 35 and 36 and SiNs 33 and 34 are formed (SINs 33 and 34 for formed initially, and then a P+ polysilicon 35 and 36 are formed, this P+ polysilicon may be a in-situ-doped, and which may be activated after ion implant. A P+ amorphous silicon may be employed to substitute the P+ polysilicons 35 and 36. The width of silicon nitride 33 and 34 are approximately from 50 to 200 nm, while the width of P+ polysilicons 35 and 36 are approximately 50 to 400 nm).

Next, it is similar to the reference [3] and the first method, a inverse-tone gate mask 37 (which is exactly opposite to normal gate mask) may be used, and R. I. E. is used to etch the double stack of the P+ silicon 35 and 36 and SiNs 33 and 34, and a high energy boron ion implant with zero tilt angle is used to form a P+ gate 40 on a single-crystal silicon, further, two thin sidewall spacers 38 and 39 may be formed (for example, a LPCVD oxide is grown firstly, and then by a R. I. E. etching to form said spacers).

Next, a photoresist layer is used to protect the area containing the source side so to the sidewall spacer 39 of the drain side 322 may be removed selectively (for example, by using HE or BHE). As shown in FIG. 3. After said photoresist has been removed, a thermal phosphoric acid is used to under cut said silicon nitride 34 of the drain side 322 so to attain that shown in FIG. 3B. The final TTT is dependent on the offset of the drain 322 of final TFT, which may be exactly controlled by the temperature and time of said thermal phosphoric acid. Furthermore, the P+ polysilicon layer may be removed by a proper solution (for example, dash etch, reference [4, 5, 6]) and this will not destroyed the silicon nitrides 33 and 34 and minor n- type active channel exposed.

Next, it is similar to the methods in reference [3] and first method, and then silicon nitrides 35 and 36 are used to block the local oxidization, and said block oxide 39 is formed on the region without protecting by silicon nitrides 35 and 36 (i e. active channel of TFT). Then the block oxide layer 39 is used to protect the active channel region to perform the ion implant of source/drain, even the silicated processing of source/drain 321 and 322. The other process may be performed by that in the conventional method.

Finally, if the sidewall spaces 38 and 39 are neglected in the second method, the silicon nitrides 32 and 34 of said source 321 and drain 322 are undercut directly, then a TFT with source offset and drain offset are obtained. Since the offset of source 321 has no critical effect to reduce leakage current, but it will has large effect to the reduction of driving current do that the obtained on/off current ratio of TFT is be worse than that only has drain 322 offset but without source offset 321, but the manufacturing process is easier.

Many changes and modifications in the above described embodiment of the invention can, of course, be carried out without departing from the scope thereof Accordingly, to promote the progress in science and the useful arts, the invention is disclosed and is intended to be limited only by the scope of the appended claims.

REFERENCE

[1] S. Ikeda, et al., polysilicon transistor technology for large capacity SRAM, * Technical Digest of IEEE Electron Devices Meeting. pp. 469–472, December 1990.

[2] T. Yamanaka. et al., * A 5.9 um$^2$ super low power SRAM cell using a new phase-shift lithography, * Technical Digest of IEEE Electron Devices Meeting, pp. 477–480, December 1990.

[3] J. R Pfiester, J. D. Hayden. c. d. Gunderson, J. H. Lin, and V. Kaushik, * A novel PMOS SOI polysilicon transistor, * IEEE Electron Device Letter, pp. 349–351, August 1990.

[4] B. Schwartz and H. Eobbin, hemical etching of silicon, The system HF, NH03, H2O, and HC2H302 * J. Electronchem Soc. V. 106, pp. 505–5–8, 1959; V. 107, pp. 108–111, 1960; V. 108, pp. 365–372, 1961.

[5] R. M. Finne, and D. L. Klein, water amine complexing aget system for ething silicon, * E. C. S. J., V. 114, Sep. 1967.

[6] J. B. Pince, nisotropic etching of silicon with KOT-H2O isopropyl, * ECS semiconductor Silicon, pp. 339–353.

What is claimed is:

1. A self-aligned manufacturing method of a thin film transistor for forming a single-crystal bottom-gate and an offset drain comprising the steps of:

(1) providing a single-crystal silicon wafer as a substrate;

(2) growing a thin gate insulation layer on said substrate by an oxidizing method, low pressure chemical vapor deposition or plasma enhanced chemical vapor deposition;

(3) growing a polysilicon layer by depositing and sputtering methods, or through the thermal processing of a deposited amorphous silicon layer;

(4) the undesired polysilicon layer being removed by a micro-image etching method, only the active channel and the source / drain region which will be formed as a transistor finally being left for connecting with wires;

(5) growing a thin silicon nitride layer;

(6) coating the structure with a photoresist layer, and removing the photoresist, P+ polysilicon or amorphous layer, and silicon nitride layer above said active channel by an inverse-tone gate mask and R. I. E. etching so as to form a groove therein;

(7) high density ions are implanted into a wafer of a single-crystal by high energy ion implant to form a gate, and the implant energy being dependent on the height of said groove, wherein the height is the total lengths of said photoresist, P+ polysilicon, silicon nitride, polysilicon layer and the thin gate insulation layer;

(8) after the photoresist having been removed, forming a sidewall insulator on the sidewall of said groove;

(9) said sidewall insulator containing the source side being protected by a photoresist, and selectively removing the sidewall insulator on the drain side;

(10) after the photoresist has been removed, the silicon nitride on the drain side being undercut by using thermal phosphoric acid, the length of the undercutting being dependent on the temperature and corrosion time of said thermal phosphoric acid;

(11) the P+ polysilicon layer being removed selectively by a solution which is dramatically corrosive to said P+ polysilicon layer;

(12) by an oxidizing method, growing a block oxide layer on the polysilicon layer which has not been protected by said silicon nitride; and

(13) in the channel region protected by the block oxide layer, the source/drain ion implant is performed, and a source/drain region is formed on said polysilicon layer which has not been protected by said block oxide layer.

2. The manufacturing method as claimed in claim 1, wherein the width of silicon nitride is about 50–200 nm.

3. The manufacturing method as claimed in claim 1, wherein the width of polysilicon layer is about 20–400 nm.

4. The manufacturing method as claimed in claim 1, wherein the width of P+ polysilicon layer is about 50–400 nm.

5. The manufacturing method as claimed in claim 1, wherein the width of sidewall insulator is about 10–200 nm.

6. The manufacturing method as claimed in claim 1, wherein the said P+ polysilicon layer may be substituted by a n+ polysilicon layer or other material that has the same function and may be selectively discarded.

7. A self-aligned manufacturing method of a thin film transistor for forming a single-crystal bottom-gate and an offset drain comprising the steps of:

(1) providing a single-crystal silicon wafer as a substrate;

(2) growing a thin gate insulation layer on said substrate by an oxidizing method, low pressure chemical vapor deposition or plasma enhanced chemical vapor deposition;

(3) growing a polysilicon layer by depositing and sputtering methods, or through the thermal processing of a deposited amorphous silicon layer.

(4) removing the undesired polysilicon layer being by a micro-image etching method, only the active channel and the source/drain region which will be formed as a transistor finally being left for connecting with wires, and other portion for connecting wires;

(5) growing a thin silicon nitride layer;

(6) forming a P+ polysilicon layer or amorphous layer;

(7) coating the structure with a photoresist layer, and removing the photoresist, P+ polysilicon or amorphous layer, and silicon nitride layer above said active channel by an inverse-tone gate mask and R. I. E. etching so as to form a groove therein;

(8) implanting high density ions into a wafer of a single-crystal by high energy ion implant to form a gate, and the implant energy being dependent the height of said groove, wherein the height is the total lengths of said photoresist, P+ polysilicon, silicon nitride, polysilicon layer and the thin gate insulation layer;

(9) after the photoresist has been removed, the silicon nitride on the drain side is undercut by using thermal phosphoric acid, the length of undercutting being dependent on the temperature and corrosion time of the thermal phosphoric acid;

(10) the P+ polysilicon layer being removed selectively by a solution which is dramatically corrosive to said P+ polysilicon layer;

(11) by an oxidizing method, a block oxide layer being grown on the polysilicon layer which has not been protected by said silicon nitride; and

(12) in the channel region protected by block oxide layer, the source/drain ion implant is performed, and a source/drain region is formed on said polysilicon layer which has not been protected by said block oxide layer.

8. The manufacturing method as claimed in claim 7, wherein the width of silicon nitride is about 50–200 nm.

9. The manufacturing method as claimed in claim 7, wherein the width of polysilicon layer is about 20–400 nm.

10. The manufacturing method as claimed in claim 7, wherein the width of P+ polysilicon layer is about 50–400 nm.

\* \* \* \* \*